United States Patent [19]
Martin

[11] Patent Number: 5,928,815
[45] Date of Patent: Jul. 27, 1999

[54] PROXIMITY MASKING DEVICE FOR NEAR-FIELD OPTICAL LITHOGRAPHY

[76] Inventor: Joseph Martin, 203 Pamola Park, Millinocket, Me. 04462

[21] Appl. No.: 08/971,054

[22] Filed: Nov. 14, 1997

[51] Int. Cl.$^6$ ...................................................... G03F 9/00
[52] U.S. Cl. ................................................................ 430/5
[58] Field of Search ............................... 430/5, 321, 322; 204/157.4; 359/664

[56] References Cited

U.S. PATENT DOCUMENTS

| | | | |
|---|---|---|---|
| 5,121,256 | 6/1992 | Corle et al. | 359/664 |
| 5,656,182 | 8/1997 | Marchman et al. | 430/4 |

*Primary Examiner*—S. Rosasco
*Attorney, Agent, or Firm*—Thomas L. Bohan

[57] ABSTRACT

A masking device for performing high-resolution photoresist-based lithography in the fabrication of integrated circuits. The heart of the device is a cylindrical block made of material transparent to, and manifesting a relatively high index of refraction for, the wavelengths of light to be used in conjunction with it. The mask end of the block is imprinted with a pattern of ridges corresponding to the pattern to be illuminated on the photoresist. The mask end, including the inter-ridge troughs, is covered with a metal film several tens of Å thick. The troughs are filled in with a material such as carbon black strongly absorptive of the wavelengths that will emerge from the mask. The sides of the block are covered with a metal cladding sufficiently thick to prevent any light from escaping from the block. The top end of the block, opposite the mask end, is left uncovered. In operation, the block is used in conjunction with a precise positioning mechanism for locating the block in the horizontal plane and for maintaining a very small, but non-zero, distance between the mask ridges and the photoresist layer, such that the photoresist layer is in the near-field of the mask. In this manner, the photoresist can be illuminated with the pattern desired, with a resolution sufficient to produce circuit elements with dimensions much less than the wavelength of light entering the top end of the mask block.

21 Claims, 5 Drawing Sheets

PROXIMITY MASKING DEVICE FOR NEAR-FIELD OPTICAL LITHOGRAPHY

BACKGROUND OF THE INVENTION

1. Field of the Invention

The present invention relates to devices for micro-circuit fabrication. In particular, it relates to lithographic fabrication techniques involving photoresist layers deployed on semiconductor material. More particularly, the present invention relates to the use of Near-Field Optical (NFO) Lithography. More particularly yet, the present invention is a mask system making use of NFO effects to overcome the diffraction limitation otherwise inherent in the use of non-contact masks to direct light patterns onto photoresist material.

2. Description of the Prior Art

The circuit-on-a-chip industry has been characterized since its inception in the 1960s by the production of chips having ever higher device densities. High densities demand high precision in the laying out of the devices and their interconnections on the semiconductor chip. As the densities have increased, so has the degree of precision demanded. For many years, the dominant response to these demands has been to use photoresist-based lithography. This lithography involves "drawing" on the photoresist an image of the circuit or of some portion of it, typically by shining ultraviolet (uv) light on the photoresist through a masking device having slits replicating the desired pattern. (Subsequent steps in the fabrication process then depend on those portions of the photoresist that had been illuminated having different physico-chemical properties than those portions that had not been illuminated.) As a general proposition it can be noted that manufacturing efficiency is improved by investing the effort required to produce a mask and then using that mask to produce large numbers of chips. The more chips that can be manufactured using a given mask, the more industry can afford to invest in a particular mask. Because of this, techniques are available for forming the patterns on the mask that would be impractical if applied directly to the individual chips.

It can be readily inferred that the device density limitations will ultimately depend on how fine the lines are that the manufacturing process can "draw" on the photoresist. For most of the history of the semiconductor industry this ultimate limit was not a concern, since factors other than the fineness of the light pattern established limits that were far grosser. As the drive to higher resolution/density proceeded, however, these factors were resolved one by one; chip fabricators are now faced with the limit imposed by the ultimate resolution of the light patterns with which the photoresist layer can be illuminated.

The limitation that now needs to be addressed is the diffraction-limited resolution attainable from light of a given wavelength $\lambda$: $\approx\lambda/2$. Since at least the time of the Young diffraction experiments in 1802, it has been known that when light is directed onto a slit so as to form an image of the slit on a surface (such as a screen) placed behind the slit, there is a lower limit to the slit width that can be faithfully imaged. As long as the slit is wider than the wavelength of the light shining on it, the image of the slit will be essentially equal to the width of the slit. However, as the slit is reduced to a width on the order of the light's wavelength, the image of the slit will first become noticeably fuzzy along the edges and, as the slit is further narrowed, the image will actually increase in width, while decreasing in intensity per unit area. This effect is often described as arising from diffraction limitations inherent in optical imaging.

In the context of semiconductor chip production, the diffraction limitations of slit imaging can be seen to apply to mask imaging, the means by which a light pattern is directed onto the photoresist layer. The light commonly used in chip fabrication at present is in the near uv, with a wavelength at or somewhat less than 3000 Ångstroms (Å) [$\approx 300 \times 10^{-9}$ m, 300 nm, $3 \times 10^{-5}$ cm, $3 \times 10^{-4}$ mm, or $0.3\mu$]. Consistent with this, the narrowest circuit elements occurring in a mass-produced semiconductor chip have a width about $0.1\mu$.

Since the "spreading out" of the imaging light occurs between the mask and the photoresist layer, one approach to avoiding the diffraction limitation is to place the mask in direct contact with the photoresist layer. (It is noted in passing that if the illumination system does not result in collimated light falling on the mask, the contact approach would be a necessity.) This "contact mask" approach does exist in the prior art and is discussed in Moreau et al., U.S. Pat. No. 3,676,002, issued in 1972, where it is described as impracticable because of the mask degradation that occurs after a relatively few uses. Moreau et al. teaches the making and use of masks that have uv-transparent material—such as silicon dioxide or a variety of photoresist itself—deposited directly onto their undersides (the sides facing the semiconductor chip) in the areas through which light is to be passed. These deposits are 5000–10000 Å thick and serve the purpose of spacing the masks above the photoresist layer. According to Moreau et al. this approach extends the life of these contact masks, while improving the optical characteristics of the light reaching the photoresist layer on the semiconductor. This patent, however, does not teach the use of this approach in order to achieve resolutions that are finer than the wavelength of the light being used in the process. Furthermore, although extended mask lifetimes are claimed, the masks in question still contact the semiconductor chip, exposing the chip and the mask to damage.

One means of deferring the diffraction limitation is to reduce the wavelength of light directed onto the mask. This quickly becomes impractical, however, because of the increased difficulty in generating the intensity needed as the wavelengths move further into the uv.

An alternative to reducing the wavelength of the incident light is to direct the light through a material possessing a high index of refraction, n, immediately before it encounters the mask's slit pattern. Since materials transparent to uv light and having values of n on the order of 1.6 are available, this approach would in principle lower the diffraction-limited line width by a factor of at least 1.6. In order to implement this approach, however, there would have to be negligible space between the slits and the photoresist layer within which the mask image is to be formed, since once the imaging light emerges from the high-n material in, for example, air, its wavelength would "snap back." The mask/spacer taught by Moreau et al. contains a suggestion of this approach in that within the space between the mask and the photoresist layer the imaging light travels in a high-n material that is directly in contact with the photoresist layer. The spacer is described as a "light pipe" capable of maintaining the light within itself as that light travels from the mask slits to the photoresist. Given the variety of angles with which the diffracted light traveling through the photoresist spacer can strike the walls of the spacer, it appears that not all of that light will be internally reflected. Furthermore, the mask of Moreau et al. is required to contact—through the spacers—the photoresist layer of the semiconductor chip. Finally, Moreau et al. is not concerned with "near-field" effects and their implication for mask imaging.

The statement that the diffraction limitation to slit-imaging resolution had been understood for centuries really holds only for "far-field" imaging, where the imaging surface is more than a few wavelengths away from the source. In the chip fabrication process, the imaging surface is the photoresist layer deployed on the semiconductor chip surface; the source is the underside of the mask. With 3000 Å light, the far-field starts at a distance of a few times 3000 Å from the mask, that is when the distance between the mask and the photoresist layer is on the order of 10000 Å ($1\mu$). It is in far-field optics that one can treat the light emerging from a slit as a distribution of plane waves propagating outward from the slit and interfering constructively and destructively with one another in such a way as to form the diffraction-limited image discussed above.

All sources of light, including slits through which light is shone, give rise to homogeneous (propagating) waves and evanescent (vanishing, falling away) waves. Unlike the former, the latter waves decay in amplitude as a function of distance from the source. The decay length depends on the wavelength of the light. These evanescent waves contain "sub-wavelength" information, i.e., information about objects significantly smaller in dimension than the illuminating wavelength. (See, e.g. "An Evanescent Field Optical Microscope," by van Hulst et al., p. 79, Proceedings American Institute of Physics Conference 241.) Evanescent waves are also associated with total internal reflection of light at an interface between materials with two different values for n. If the light is traveling in the material with the greater value for n, and is incident upon the interface at an angle (measured with respect to the normal to the interface) that exceeds a certain critical value, that light will be totally reflected back into the first material. In spite of the total reflection of the propagating waves under these conditions, there will be evanescent waves present within the second material in the region very near the interface. Should a third material having an index of refraction very close to that of the first material be very close, the evanescent wave can give rise to a propagating wave in the third material. This will happen if the third material lies within the optical near-field of the first material. Similarly, when light waves propagating in a material encounter a good conductor, such as a metal, they will be reflected regardless of the angle of incidence. In particular, they will be reflected even if they are incident perpendicularly to the conductor. Nevertheless, in such a situation, there will again be an evanescent wave present capable of causing a propagating wave to occur in material adjacent to the conducting interface if the conducting material is sufficiently thin, as, for example, in the case of a thin metal film, and the other material is very close to the film.

If the source-image separation is considerably less than the wavelength being used for imaging, one says that the imaging is occurring in the "near-field" region, or, with the wavelength falling within the optical range, the near-field optical region. In contrast to the long-established understanding of far-field imaging, near-field imaging has until recent years received little attention. See, for example, NEAR-FIELD OPTICS: Theory, Instrumentation, and Applications, by Paesler, M. A., and Moyer, P. J., Wiley-Interscience, 1992. Near-field optical techniques have within the past few years been applied to microscopy and other types of visualization, where the goal is to be able to "see" objects that are much smaller than the wavelength of the light used for illuminating the object. In such instances, it is the light reflected from a surface (e.g., microscope slide) that is of interest, in contrast to lithography, where it is the light that is incident on a surface (photoresist layer) that is of interest. There are, among the prior art, several recent patents directed at the use of near-field optical effects in microscopy. See, for example, Kino et al., U.S. Pat. No. 5,004,307, which describes near-field and solid immersion optical microscopy. The microscopy invention taught by Kino et al. is very similar to the lithography system described in Corle et al., which relates to lithography system embodying a solid immersion lens.

Many of the benefits of placing the mask directly in contact with the photoresist can be achieved, while avoiding the detriments, by placing the mask extremely close but not in direct contact. Extremely close means to within a distance much less than the wavelength of the light illuminating the mask, so that the photoresist layer lies within the "near-field" region of the light emanating from the underside of the mask. Furthermore, this technique can be combined with making the mask out of a material with a high index of refraction so that the wavelength of the light reaching the mask pattern is reduced from that of the illuminating light. This involves manufacturing the mask containing entity from a material with a high index of refraction, n. One can think of this entity as a vertically-oriented cylinder, the top end of which is illuminated by the external light which then passes through the cylinder and out the bottom face, where the bottom face contains the pattern to be imprinted on the photoresist.

As stated, the first use of near-field optical techniques was in observational microscopy, for high-resolution viewing of an object, as opposed to a high-resolution imprinting of an object. The problems to overcome when one is using light to view a surface at high resolution are very different from those that arise when one wishes to use light to create high-resolution patterns on a surface. For one thing, in the latter situation but not in the former it is necessary to tightly control scattered light, so that it does not get on those parts of the surface that are not supposed to be illuminated. In particular, successful lithography using near-field optical techniques requires a means of limiting unwanted wave propagation.

Accordingly, the prior art fails to provide any proximity mask device that utilizes uv light to image a light pattern in photoresist with dimensions much smaller than $0.3\mu$ for fabrication of integrated-circuitry. In particular, the prior art fails to provide a simple proximity mask that addresses the problem of evanescent light leakage onto the photoresist layer. Therefore, what is needed is a simple proximity mask device that provides a control means to prevent evanescent wave propagation to photoresist areas that are not to be illuminated.

SUMMARY OF THE INVENTION

It is an object of this invention to produce by photolithography the production of integrated circuits having individual elements much smaller than the wavelength of ultraviolet light. In particular, it is the object of this invention to achieve this end through the use of a modified masking device maintained in such close proximity to a photoresist layer deployed on a semiconductor surface that the photoresist layer is in the near-field of the light emerging from the masking device. It is further the object of this invention to deploy a masking device of sufficient thickness that the light passing through it has its wavelength reduced before emerging on the photoresist side of the device. In this manner, the present invention can overcome diffraction limitations without inducing the degradation that arises from the use of contact-mask techniques. Underlying the effects achieved with the present invention is its method of achieving patterned light output; instead of the traditional thin masks containing a pattern of lines transparent (to the illuminating light) in an opaque background, the present invention uses a relatively thick "mask block" that is uniformly transparent to the illuminating light. While propagating through the material making up the mask block, the light has a shortened wavelength. Because the photoresist to be patterned lies within the optical near-field of the underside of the mask, this wavelength shortening further contributes to the overcoming of the diffraction limitation on the "fineness" of the photo-transformed lines that can be placed in the photoresist.

The mask device of the present invention is placed at the end of a solid block of material (mask block) made of a solid material transparent to the illuminating light and having an index of refraction significantly greater than unity. The mask block will have a top (the illumination end), onto which the illuminating light is directed from an outside source, a bottom (the mask end), from which emerging light shines on the photoresist, and a side or sides depending on the exact cross-section, which can be any of a number of shapes, including but not limited to rectangular and circular. This mask block will be coupled to a precise positioning device, and a means for controlling unwanted evanescent waves.

The invention may be implemented in a variety of ways, including, but not limited to, the creation of a relief pattern on the mask end of the mask block, over which a composite layering of opaque reflective metal and carbon backfill are applied. The mask block may be held in position by a stage actuator device to keep the mask end immediately adjacent to, but not in contact with, the photoresist.

In the present invention, evanescent waves are restricted to the desired photoresist regions by a reflective coating on the contact mask relief pattern and a carbon backfill material placed within the depressions between the relief ridges. While the Preferred Embodiment discloses a carbon material as part of the means for controlling evanescent wave propagation, the means for controlling evanescent wave propagation may utilize any material in which the light is strongly attenuated.

Another important aspect of the invention is the means for precise positioning of the optical medium with the NFO contact mask in relation to the photoresist layer. Included in this means for precise positioning is the method of identifying the exact spatial relationship at any given time between the contact mask and the photoresist. While the preferred embodiment discloses a particular stage actuator for micro-metric positioning up, down, and horizontally, as a means for precise positioning, the precise positioning may be accomplished by any other micro-metric staging device. Further, while the Preferred Embodiment discloses a capacitance feedback device as a means for identifying the exact spatial relationship between the contact mask and the photoresist as a function of the changes in electrical capacitance measured over the two parallel planes formed by the contact mask and the photoresist, the exact spatial relationship between the contact mask and the photoresist may be accomplished by any means suited to feedback analysis.

These and other objects and advantages of the present invention will be made apparent upon review of the following detailed description of the Preferred Embodiment of the present invention, the accompanying drawings, and the appended claims.

PREFERRED EMBODIMENT OF THE INVENTION

Figure 1:
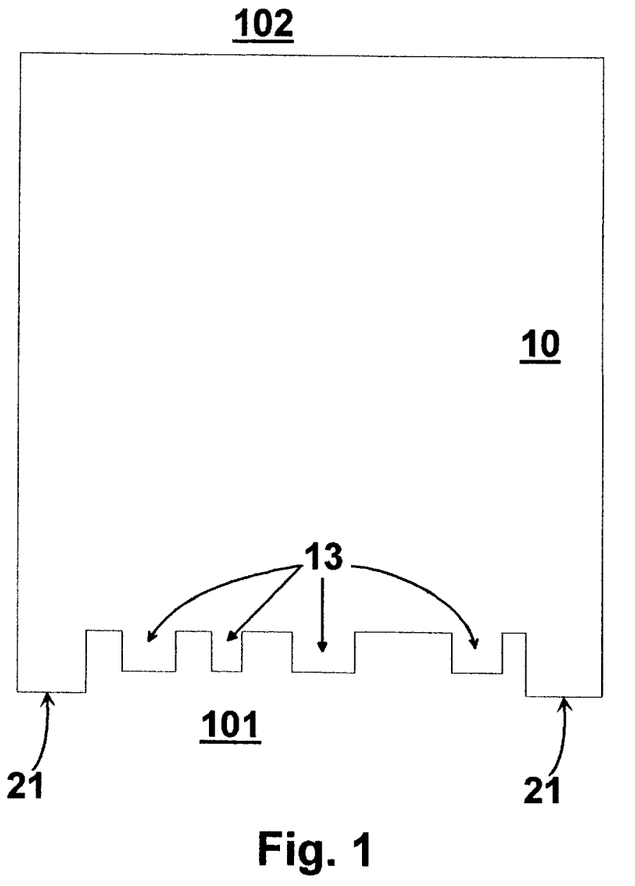
FIG. 1 is a cross-sectional schematic view of the mask block used in the present invention, before any material has been deposited on the exterior of the block.
Figure 2:
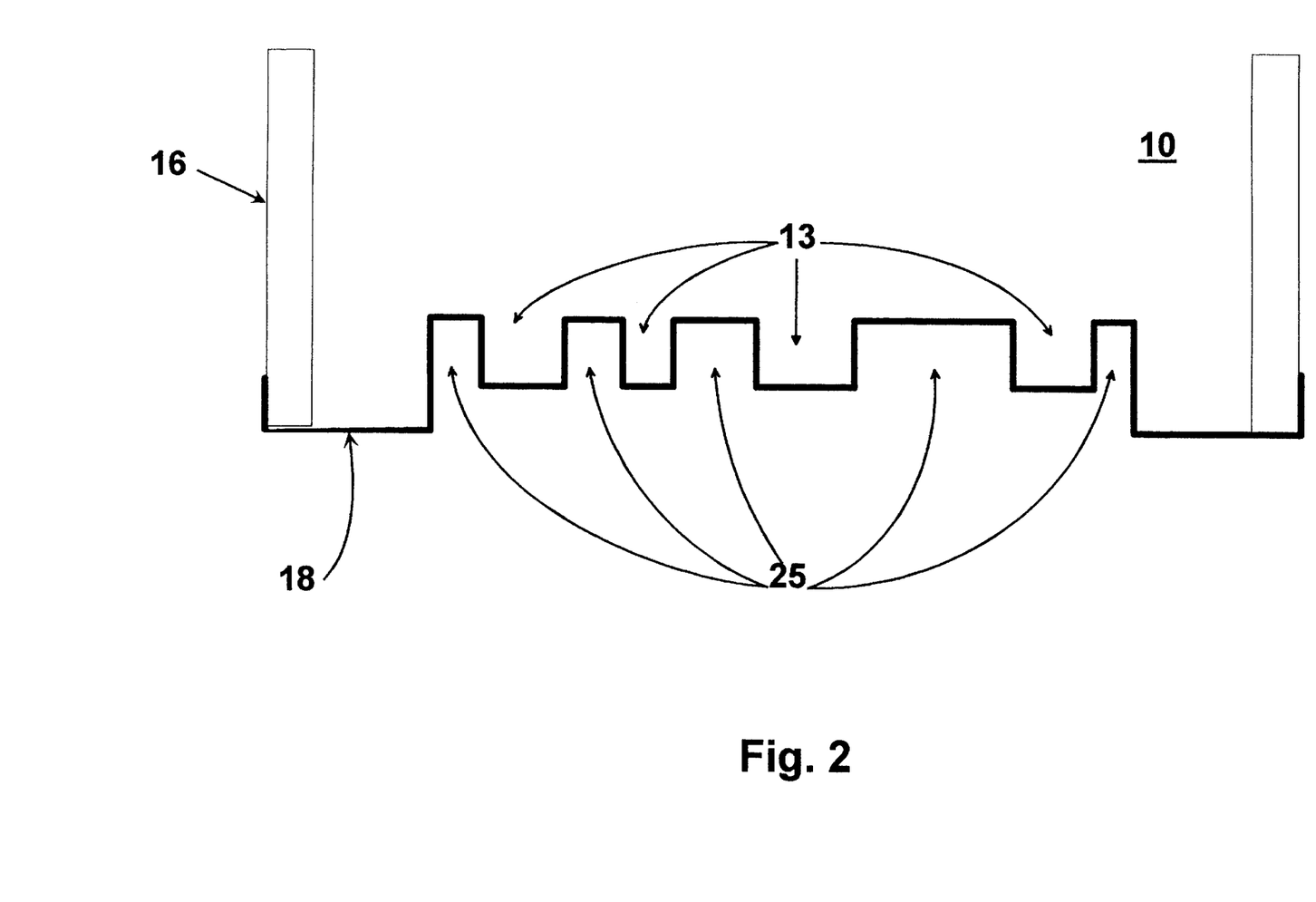
FIG. 2 show the mask end of the mask block after the side cladding and thin film have been added.
Figure 3:
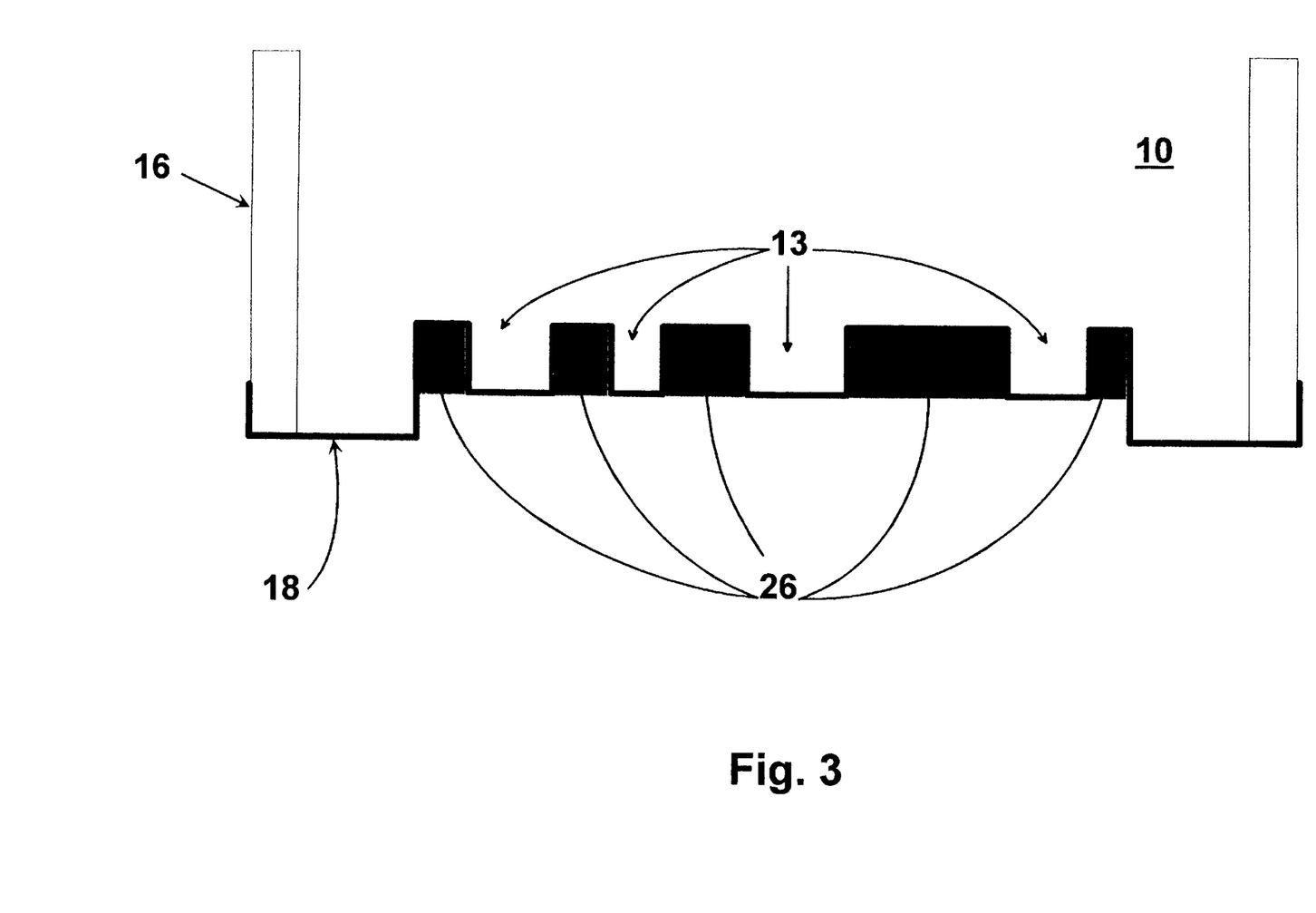
FIG. 3 is similar to FIG. 2, but with the backfill added to fill in the troughs on the mask end of the mask block.

The heart of the present invention is a mask block 10, shown in FIGS. 1–3. In the Preferred Embodiment the mask block 10 is a right cylinder of lithium fluoride possessing a mask end 101 and an illumination end 102. Into the mask end 101 is imprinted a trough pattern 25, resulting in a ridge pattern 13 where the ridge pattern 13 replicates a circuit pattern sought to be imposed on a photoresist surface 19. The trough pattern 25 can be imprinted by a variety of techniques; in the Preferred Embodiment it is created using electron-beam lithography. In addition to the ridge pattern 13 a spacer ridge 21 is left around the perimeter of the mask end 101 in the Preferred Embodiment. Note that the relative dimensions shown in the Figures are not to scale. Although the vertical dimension of the mask block 10 will be chosen for convenience of manufacture and use, it is anticipated that it will be smaller relative to the horizontal dimension than is suggested by the Figures.

As is illustrated in FIG. 2 and other Figures, all surfaces of the mask block 10 except for the mask end 101 and the illumination end 102 are coated with a reflective cladding 16. In the Preferred Embodiment, the cladding 16 is a layer of aluminum sufficiently thick to reflect all light striking it from within the mask block 10. As is also illustrated in FIG. 2, a thin conducting film 18 is applied so as to cover all exposed surfaces of the mask end 101. In the Preferred Embodiment of the invention, the conducting film 18 is a layer of aluminum approximately 30 Å thick. One or more fine electric leads 17 are electrically attached to the conducting film 18. The electric leads 17 along with an electric lead 31 coupled to said photoresist 19 are couplable to a feedback device 29 capable of measuring capacitance and generating resultant error signals that are used to control an actuator device 24 that positions the mask block 10.

After the film 18 has been deposited on the mask end 101 a layer of light-absorbent backfill 26 is applied to the mask end 101. In the Preferred Embodiment, this material is carbon black; however, any material will suffice that is highly absorbing of light and possessing mechanical properties allowing it to fill in all of the trough pattern 25. The backfill 26 is applied to the mask end 101 in such a way that the ridge pattern 13 as well as the spacer ridge 21 are left exposed.

Figure 4:
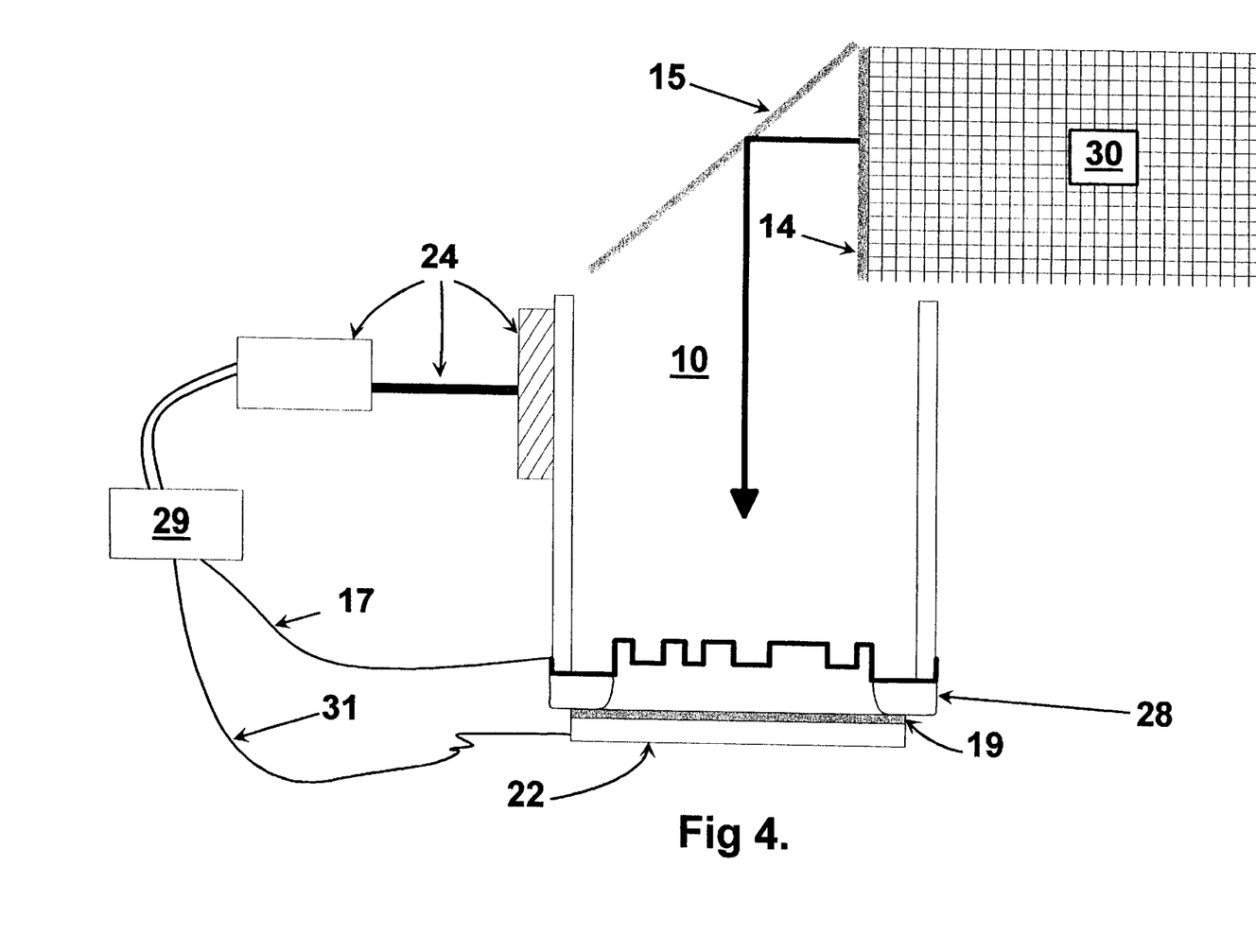
FIG. 4 is an overall schematic view of the proximity mask in conjunction with a light source, a photoresist covered semiconductor chip, and positioning device. This also shows the optional compressible lining around the perimeter

The position, both horizontal and vertical, of the mask block 10 with respect to the photoresist surface 19 is maintained by the actuator device 24 that, in the Preferred Embodiment, is piezo-electric based and driven by an error signal from the capacitance monitor 29. The actuator device 24 can hold the mask end 101 above the photoresist surface 19 a distance sufficient to ensure that the photoresist surface 19 is in the near-field of light emerging from the mask end 101. This positioning can be done using the spacer ridge 21, or without it, in which case the spacer ridge 21 will not be allowed to extend outward from the ridge pattern 13. As another variant on the positioning of the mask block 10, a layer of compressible material 28 as illustrated in FIG. 4 can be used.

A wide variety of light sources and filters are well known to those skilled in the field of optics and may be used with the proximity mask device of the present invention. For instance, a helium or sodium arc light source may be used with a silica filter. FIG. 4 provides a stylized illustration of the mask block 10 coupled to a light source 30 that, through a series of optical devices directs light onto the illumination end 102. In the Preferred Embodiment, light from the light source 30 is focused through a thermal wavelength filter 14 of a material designed to filter out all wavelengths of light longer than that of ultraviolet light, which is reflected off a mirror 15 so as to strike the illumination end 102 of the mask block 10. Light from the light source 30 travels through the mask block 10. The cladding 16 ensures that all of the light passing through the mask block 10 reaches the mask end 101. When the light reaches the mask end 101, it encounters the thin film 18, either in that portion of the mask end consisting of the trough pattern 25 or of the ridge pattern 13.

Figure 5:
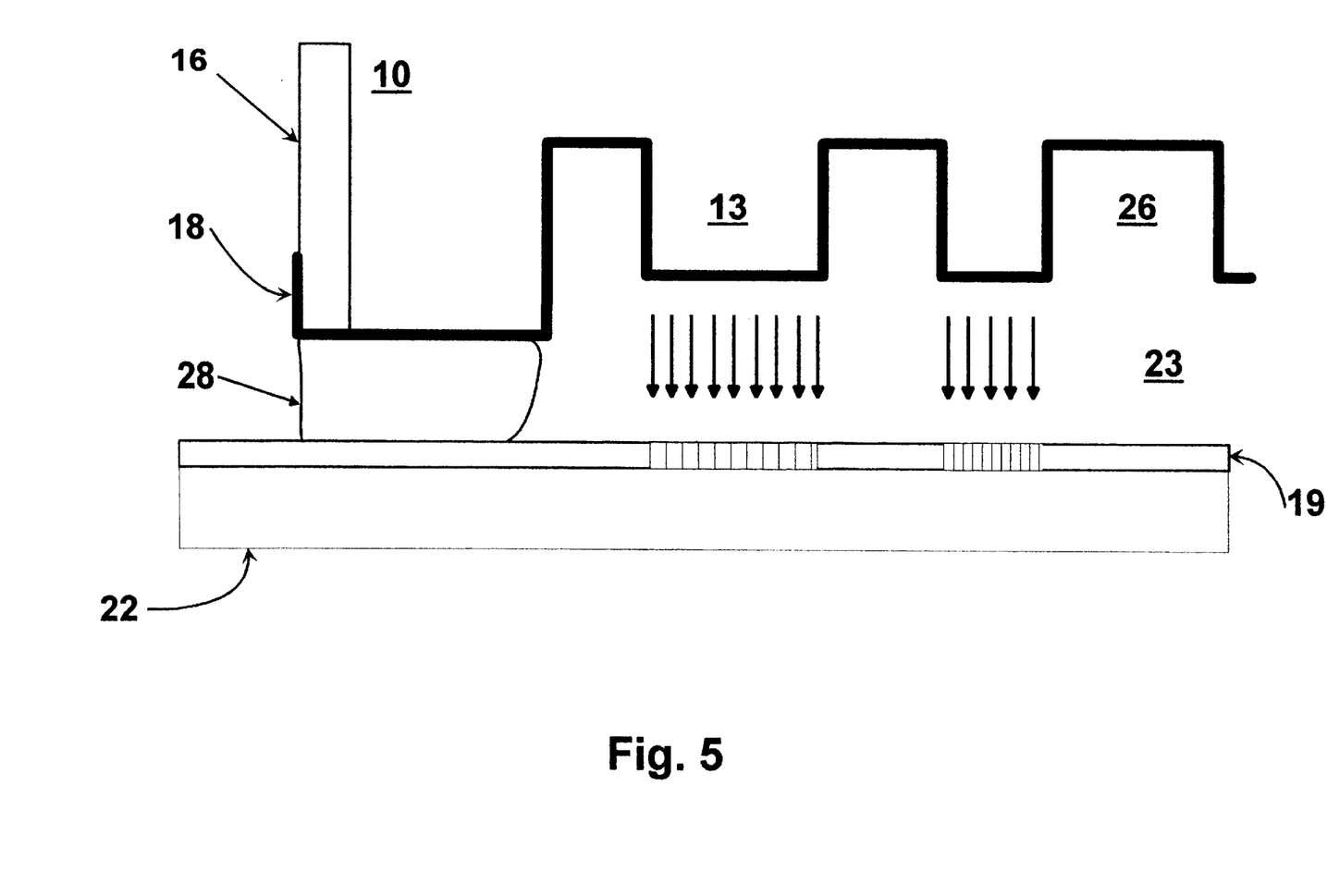
FIG. 5 is an enlarged view of the mask end of the system, showing light traveling from the ridge pattern of the mask block onto photoresist.

The light traveling through the mask block 10 would normally be totally reflected by the material constituting the thin film 18. Nevertheless, in addition to the reflected light wave there is an exponentially decaying wave—an evanescent wave—that penetrates into the thin film 18 a distance comparable to the wavelength of the light, which will be on the order of 3000 Å. Since by design and construction, the thickness of the thin film 18 is about $\frac{1}{100}$ of the wavelength, the evanescent wave will be non-vanishing on the underside of the thin film 18. That portion of the light that penetrates the thin film 18 in the trough pattern 25 is absorbed by the absorbent material constituting the backfill 26. This portion of the light is made up both of light that strikes the bottoms of the backfill 26 at perpendicular incidence and the light that emerges from the sides of the elements making up the trough pattern 25. The portion of the light that strikes those portions of the thin film 18 that is covering the ridge pattern 13 will encounter, a short distance from the ridge surfaces, the photoresist 19. It is then this evanescent wave that has penetrated the thin film 18 that provides the light pattern on the photoresist 19.

An important aspect of the present invention is the precise positioning of the contact mask relief pattern 13 relative to the photoresist 19 for feature imaging. In order for the light exiting the mask block 10 to retain its shortened wavelength in the photoresist 19, the near-field spatial relationship between the mask end 101 and the photoresist 19 must be maintained. In the Preferred Embodiment, this is achieved by mounting the mask block 10 on a piezo-electric-controlled stage actuator 24 for micro-metric positioning up, down, and horizontally. As indicated above, the stage actuator 24 ultimately is controlled by means of a feedback signal generated from the measurement of the capacitance between the thin film 18 and the photoresist 19.

It should be understood that the details provided for the Preferred Embodiment are not intended to limit the present invention. Numerous variations in design and use of the present invention may be developed by those skilled in the relevant art.

I claim:

1. A near-field optical lithographic mask device for imaging a desired pattern of light onto a photoresist layer, said mask device comprising:

a) a mask block having a mask end and an illumination end, said illumination end having a flat exterior surface, and b) a positioning mechanism capable of precisely maintaining said mask in a predetermined vertical position and a predetermined horizontal orientation with respect to said photoresist layer;

where said mask block is approximately cylindrical in shape and made of a material that is transparent to wavelengths of light to be used in said imaging and where said mask end has imprinted thereon a pattern of ridges and troughs, said ridges replicating said desired pattern, and where said troughs are filled with a light-absorbing material.

2. The mask device of claim 1 wherein all outside surfaces of said mask block apart from said mask end and said illumination end are covered with a metallic cladding sufficiently thick to completely reflect all said light.

3. The mask device of claim 2 wherein a thin metal film extends across all of said mask end.

4. The mask device of claim 3 wherein said material has a relatively high index of refraction for said light.

5. The mask device of claim 4 wherein said positioning mechanism utilizes a measurement of a capacitance between said mask block and said photoresist layer.

6. The mask device of claim 5 wherein said measurement is carried out by means of a first electrical lead attached to said metal film and a second electrical lead attached to said photoresist.

7. The mask device of claim 6 wherein said positioning device also utilizes a piezo-electric crystal to generate movement of said mask block with respect to said photoresist layer.

8. The mask device of claim 7 wherein said mask has, in addition to said pattern of ridges and troughs, a spacing ridge encircling said pattern, wherein said spacing ridge extends above said ridges by a few tens of Å.

9. The mask device of claim 8 wherein said spacing ridge is made of said material and is an integral part of said mask block.

10. The mask device of claim 8 wherein said spacing ridge is a compressible cushion.

11. The mask device of claim 9 wherein a compressible cushion lies atop said spacing ridge.

12. The mask device of claim 4 wherein said light is ultraviolet light.

13. The mask device of claim 12 wherein said material is lithium fluoride.

14. A near-field optical lithographic mask device for imaging a desired pattern of light onto a photoresist layer, said mask device comprising:

a) a mask block having a mask end and an illumination end, said illumination end having a flat exterior surface, and b) a positioning mechanism capable of precisely maintaining said mask in a predetermined vertical position and a predetermined horizontal orientation with respect to said photoresist layer, wherein said mask block is approximately cylindrical in shape and made of a material having a high index of refraction and is transparent to ultraviolet light to be used in said imaging and wherein said mask end has imprinted thereon a pattern of ridges and troughs, said ridges replicating said desired pattern, wherein a thin metal film is placed on said mask end, said thin metal film covering all ridges and troughs, wherein said troughs are filled with a light-absorbing material, and wherein said mask block has a metal cladding covering all outside surfaces except for said mask end and said flat exterior surface of said illumination end, wherein said metal cladding is sufficiently thick to reflect all ultraviolet light being transmitted through said mask block.

15. The mask device described in claim 14 coupled with an illumination system designed to illuminate said illumination end of said mask block.

16. The mask device described in claim 15 wherein said illumination system shines ultraviolet light onto said illumination end of said mask block after said ultraviolet light has passed through a optical-thermal filter.

17. A method of using semiconductor lithography to produce circuit elements of dimension much less than ultraviolet-light wavelengths by taking advantage of near-field optical techniques, said method comprising the following steps:

(a) forming a cylindrical object having a mask end and an illumination end from a bulk material that is transparent to, and has a high index of refraction for, ultraviolet light, (b) imprinting on said mask end a pattern of ridges and troughs wherein said ridges correspond to a circuit or portion of a circuit, (c) depositing on said pattern of ridges and troughs a thin film of a conductive material, (d) filling said troughs with a light-absorbing material, (e) placing a cladding on all surfaces of said cylindrical block except for said mask end and said illumination end with a conductor to a thickness necessary to completely reflect light incident on said cladding, (f) coupling said cylindrical block containing said film, said cladding, and said light-absorbing material onto a precise positioning device, so that said mask end is horizontal and is lower than said illumination end, (g) use said positioning device to position said cylindrical block above a photoresist layer deployed on a semiconductor chip in which a circuit is to be fabricated, such that said mask end is parallel to and in close proximity to said photoresist layer, (h) directing collimated ultraviolet light onto said illumination end at normal incidence.

18. The method described in claim 17 wherein said bulk material is lithium fluoride.

19. The method described in claim 17 wherein said bulk material is silicon dioxide.

20. The method described in claim 18 wherein said positioning device is a piezo-electric device directed by an error signal proportional to a capacitance measured between said thin film and said photoresist layer.

21. The method described in claim 20 wherein said thin film is 30 Å thick aluminum and said cladding is 1 mm thick aluminum.

* * * * *